United States Patent
D'Alessandro (10) Patent No.: US 12,405,386 B2
(45) Date of Patent: Sep. 2, 2025

(54) METHOD FOR ADJUSTING A PHASE OF A CARRIER REPLICA SIGNAL

(71) Applicant: u-blox AG, Thalwil (CH)

(72) Inventor: Carmine D'Alessandro, Thalwil (CH)

(73) Assignee: u-blox AG, Thalwil (CH)

( * ) Notice: Subject to any disclaimer, the term of this patent is extended or adjusted under 35 U.S.C. 154(b) by 408 days.

(21) Appl. No.: 18/165,615

(22) Filed: Feb. 7, 2023

(65) Prior Publication Data

US 2023/0258819 A1 Aug. 17, 2023

(30) Foreign Application Priority Data

Feb. 11, 2022 (EP) ..................................... 22156334

(51) Int. Cl.
*G01S 19/29* (2010.01)
(52) U.S. Cl.
CPC ..................... *G01S 19/29* (2013.01)
(58) Field of Classification Search
CPC ............................... G01S 19/29; G01S 19/246
USPC ......................................................... 375/376
See application file for complete search history.

(56) References Cited

U.S. PATENT DOCUMENTS

| | | |
|---|---|---|
| 9,300,354 B2 | 3/2016 | Floch et al. |
| 2006/0022868 A1 | 2/2006 | Awata |
| 2008/0318543 A1 | 12/2008 | Aizawa |
| 2020/0266823 A1 | 8/2020 | Chu |
| 2022/0209805 A1* | 6/2022 | Yu ...................... H04B 1/0007 |

OTHER PUBLICATIONS

European Extended Search Report in European Appln. No. 22156334.9, dated Aug. 3, 2022, 11 pages.

* cited by examiner

*Primary Examiner* — Dominic D Saltarelli
(74) *Attorney, Agent, or Firm* — Fish & Richardson P.C.

(57) ABSTRACT

In an example embodiment, a method for adjusting a phase of a carrier replica signal includes receiving, by a tracking loop, a digital baseband signal, generating within the tracking loop the carrier replica signal, generating within the tracking loop a sequence of samples from the digital baseband signal and the carrier replica signal, and controlling a phase of the carrier replica signal depending on the sequence of samples. The example method further includes receiving a trigger signal indicating an upcoming phase shift of the digital baseband signal, blanking the tracking loop and controlling the phase of the carrier replica signal using a constant value, determining a magnitude of the phase shift, adjusting the phase of the carrier replica signal using the determined magnitude of the phase shift, and un-blanking the tracking loop and controlling the phase of the carrier replica signal depending on the sequence of samples.

19 Claims, 6 Drawing Sheets

METHOD FOR ADJUSTING A PHASE OF A CARRIER REPLICA SIGNAL

CROSS-REFERENCE TO RELATED APPLICATIONS

This application claims the benefit of priority to European Application No. 22156334.9, filed on Feb. 11, 2022, the contents of which are hereby incorporated by reference.

TECHNICAL FIELD

The present disclosure relates to the field of positioning, especially to tracking of a satellite signal. Specifically, the disclosure is directed to a method for adjusting a phase of a carrier replica signal, a tracking loop, a global navigation satellite system receiver, a computer program product and a computer readable medium.

BACKGROUND

Many electronic products today, e.g. global navigation satellite system, GNSS, receivers operate in accordance with a preset frequency or range of frequencies. To operate in accordance with a given frequency, an electronic device usually generates the given frequency internally. This generated frequency effectively regulates the device's operation. For example, a processor's clock speed, a transceiver's radio frequency range, a control setting of a phase locked loop, PLL, etc. are each related to a given frequency that regulates their operation. Hence, most electronic devices, as well as the integrated circuits, ICs, that are utilized therein, perform better with superior frequency generators or frequency synthesizers.

There are multiple approaches to generating a frequency within a device. One such approach is a voltage-controlled oscillator, VCO. A voltage that is input to the VCO sets a frequency that is output by the VCO. In other words, adjusting the input voltage adjusts the output frequency. An example VCO type is an inductive-capacitance VCO, referred to as an LC-VCO. An LC-VCO produces a voltage oscillation at a given frequency which is inversely proportional to the inductance and capacitance of the LC circuit—see equation (1) below.

Circuits having VCOs utilize some scheme and/or technique to tune the VCO to a desired frequency. LC-VCOs in particular may be tuned, at least in part, using one or more tuning banks, for example a capacitor tuning bank. By switching a series of capacitors in or out of the tuning bank, which is known as CapTune switching, the desired frequency can be obtained. LC-VCOs with better tuning banks can therefore operate more precisely and/or with an overall higher quality. Consequently, computers, mobile phones, radio units, high speed interfaces etc. can benefit from an LC-VCO with a well-designed tuning bank.

Typically, phase and/or frequency of a clock signal provided or generated by such LC-VCOs are regulated by means of a PLL.

Figure 1:
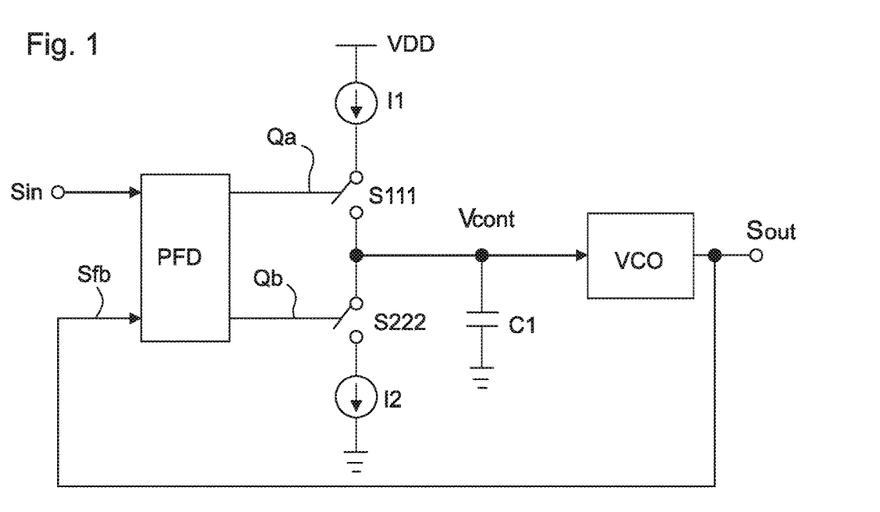
FIG. 1 shows a state-of-the-art example of a type II PLL.

FIG. 1 shows a state-of-the-art example of a type II PLL. The PLL, in particular the VCO therein, generates an output signal Sout, e.g. a voltage, the phase of which is related to an input signal or voltage Sin. For this the output signal Sout is fed back as feedback signal Sfb to a phase frequency detector, PFD. The PFD compares the phase of the feedback signal Sfb to the phase of the input signal Sin and accordingly provides control signals Qa and Qb which control a charge pump having current source and current sink generating currents I1 and I2, as well as switches S111 and S222. The charge pump consequently provides a control voltage Vcont to the input of the VCO which adjusts the phase and frequency of the output signal Sout.

Upon CapTune switching, the control voltage Vcont changes, implying a shift in the operating point of transistors used inside the charge pump to generate the currents I1 and I2. This causes a shift in the mismatch of these currents and consequently a change in phase at the input of the PFD to compensate for the mismatch change. A phase jump of the output signal Sout is the consequence. For example, a mismatch in currents of 100 nA may imply a phase shift of 50 to 80 degrees.

Figure 2:
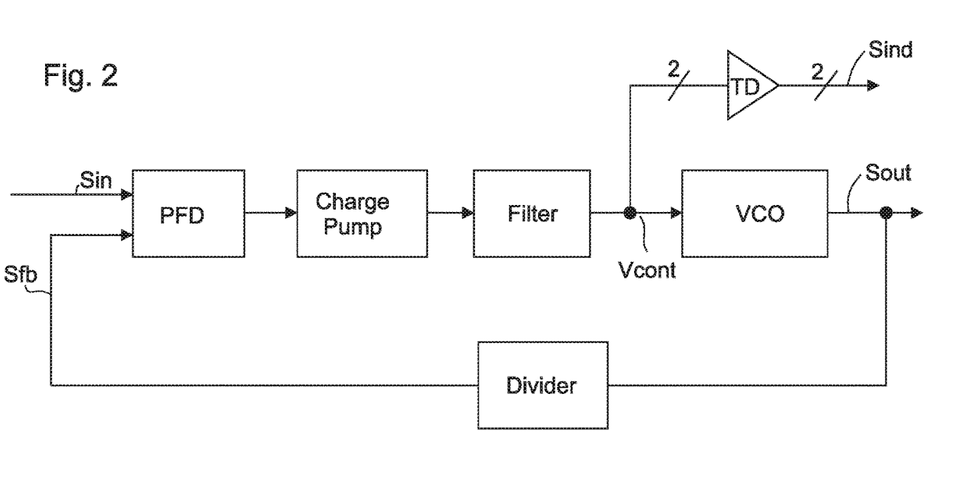
FIG. 2 shows another state-of-the-art PLL architecture.

FIG. 2 shows another state-of-the-art PLL architecture, which may be used especially in connection with radio frequency, RF, applications and corresponding devices, such as GNSS receivers. The depicted PLL has the PFD, the charge pump, a filter, typically a low pass filter, the VCO, and a frequency divider circuit in the feedback path which provides the feedback signal Sfb. Once again, the VCO provides the periodic output signal Sout, the frequency of which depends on the control or tuning voltage Vcont. The tuning voltage Vcont is set by means of the loop such that it corresponds to the wanted frequency. The level of the tuning voltage Vcont is detected by means of one or more tuned detectors which provide an indication signal Sind indicating if the tuning voltage Vcont is tuned high or low.

Figure 3:
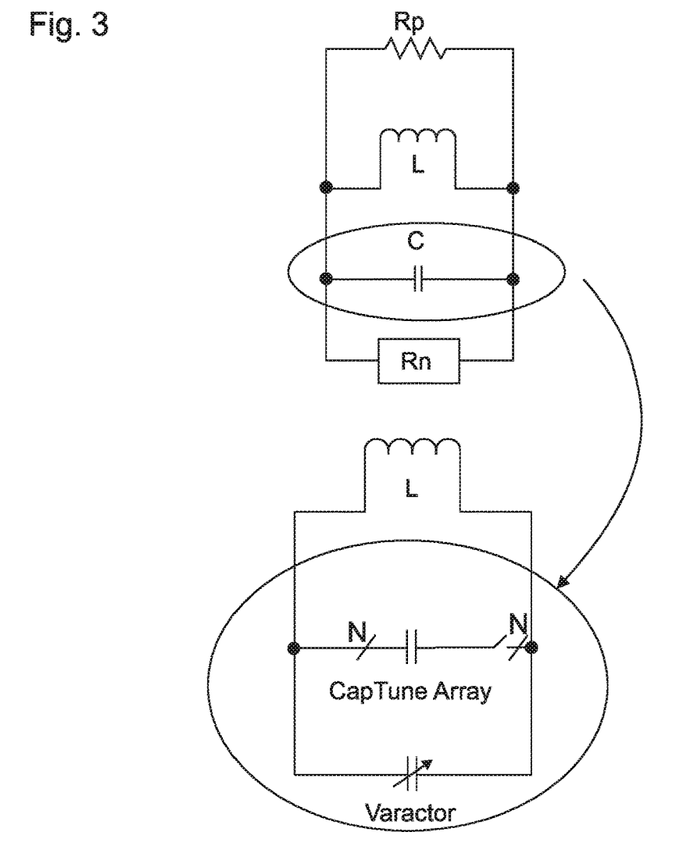
FIG. 3 shows an LC-VCO equivalent circuit.

FIG. 3 shows an equivalent circuit of what is implemented by the VCO of FIG. 1 or 2. The active oscillator core provides a negative resistance Rn that compensates the losses which are modelled in FIG. 3 with resistance Rp. The frequency realized by the VCO is given by $$f = \frac{1}{2\pi * \sqrt{LC}} \qquad \text{Eq. (1)}$$

Therein f represents the frequency f output by the VCO with the output signal Sout, L represents the inductance L and C represents the capacitance C.

For proper function as a VCO, the capacitance value of capacitor C is significantly dependent on the tuning voltage Vcont as shown in FIG. 1 or 2. An implementation example for the capacitor C is shown in the lower part of FIG. 3. This implementation consists of a varactor which is connected in parallel with a CapTune array, i.e. a bank of capacitors. This implementation is due to the fact that the capacitor C cannot be realised only by the varactor because of limitations in varactor design and process, temperature and voltage, PVT, variations. Therefore, the bank of capacitors, i.e. the Cap-Tune array having N elements which can be switched in or out as shown, is used. During operation of the VCO, the CapTune array provides a coarse tuning with its setting, while the varactor provides a fine tuning by means of the loop.

Figure 4:
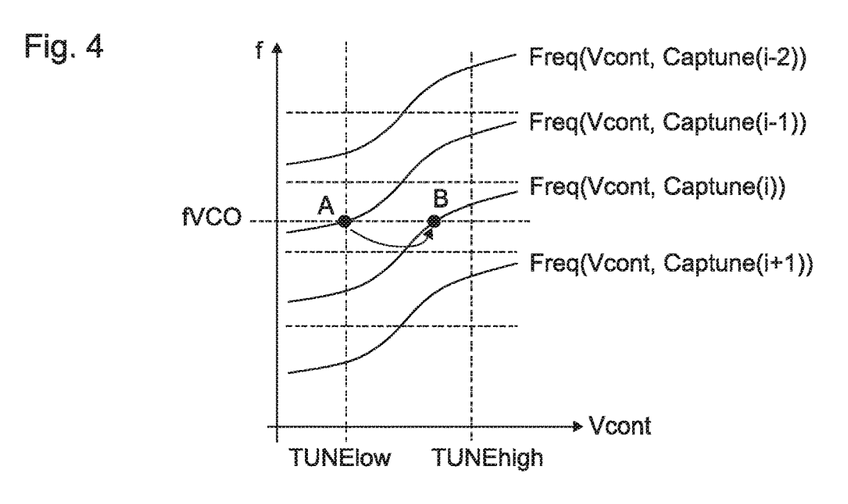
FIG. 4 shows an example of a possible scenario regulating the frequency of the VCO within the PLL.

FIG. 4 shows an example of a possible scenario regulating the frequency of the VCO within the PLL. The control voltage Vcont is shown on the x-axis, while the resulting frequency $f_{VCO}$ of the VCO is shown on the y-axis.

It can be determined from FIG. 4 that by changing the control voltage Vcont, the capacitance of the varactor changes and the operating point of the VCO moves along a given curve. This results in a corresponding VCO frequency change. By changing the CapTune array setting with index i, the operating point moves to a particular curve, i.e the operating point of the VCO is shifted up or down. In other words, changing the CapTune array setting results in different s-shaped curves as shown in FIG. 4. For a certain frequency $f_{VCO}$, which is requested, there are two different possible CapTune array settings, in the depicted example i and i−1 corresponding to operating points B and A, respectively. By design, the control voltage Vcont has to be maintained within the range defined by voltage values TUNElow and TUNEhigh. This information is provided by the tune detectors shown in FIG. 2, especially by the indication signal Sind. In an exemplary scenario, operating point A is used at the RF PLL start-up. Correspondingly, CapTune setting i−1 is used. Then, after some time, the temperature changes in a way that the s-shapes move upwards, for instance because the capacitance changed. The tune detector is triggered and reports a low voltage tune with the indication signal Sind. This information is used to drive the selection of another CapTune array setting corresponding to setting i in the depicted example. By this reconfiguration the operating point B is chosen. Said switching of the CapTune array from setting i−1 to setting i results in a phase shift of the output signal Sout of the VCO.

Such a PLL with a VCO using CapTune switching is employed in a GNSS receiver, for example, especially in an RF front-end of such a receiver. Here it serves for generating a reference clock signal in order to provide a baseband signal which reflects the signal of the tracked satellite. In this kind of application there is a high risk that, due to the CapTune switching and resulting phase jump or shift in the reference clock signal, the satellite signal shall be lost.

Figure 5:
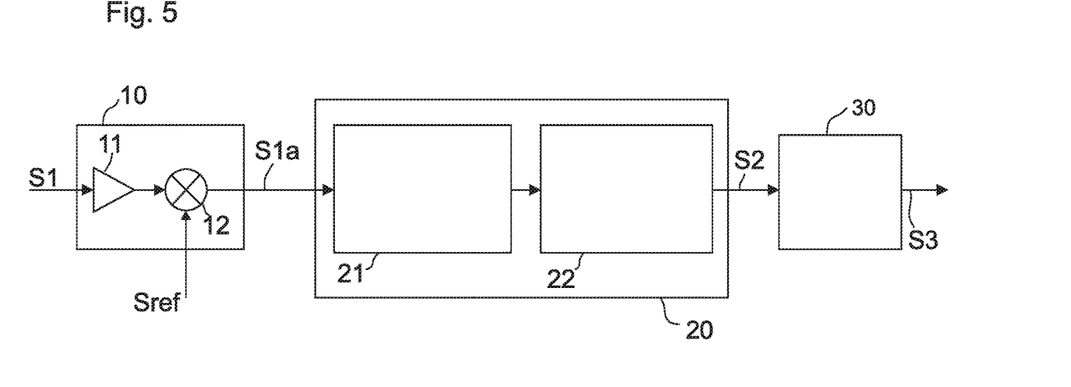
FIG. 5 shows an example of a GNSS receiver.

FIG. 5 shows an example of a state-of-the-art GNSS receiver. The receiver comprises an RF front-end circuit 10, a baseband processing circuit 20 coupled downstream of the RF front-end circuit 10 and a tracking engine 30 which is coupled downstream of the baseband processing circuit 20. The RF front-end circuit 10 receives an input signal S1, which contains an RF signal transmitted by a navigation satellite. The RF front-end circuit 10 comprises at least a low-noise amplifier, LNA, 11 and a mixer 12. The input signal S1 is amplified and mixed with a reference clock signal Sref to provide a down-converted input signal S1a. The reference clock signal Sref therein is provided by a local oscillator having, amongst other things, a VCO which relies upon CapTune switching. The mixing operation performed in mixer 12 down-converts a GNSS signal, i.e. input signal S1, from the RF carrier frequency in the range of gigahertz to a so-called intermediate frequency in the range of some tens of hertz (Hz) providing the intermediate frequency signal or analogue baseband signal S1a.

The baseband processing circuit 20 has an analogue part 21 and a digital part 22 for providing the digital baseband signal S2 at its output as known by those skilled in the art.

Tracking engine 30 has hardware and/or software modules that implement a tracking loop with the received GNSS signal. The tracking loop designates a control loop which is used by the receiver shown in FIG. 5 to track the received satellite signal in order to estimate certain parameters of the GNSS signal which enable an accurate value of a distance between the receiver and a satellite that transmits the satellite signal to be determined. Parameters that are evaluated in the tracking loop include, for example, carrier phase shift, a Doppler shift and/or a code delay. For this purpose, the tracking loop implemented by the tracking engine 30 generates and regulates a phase of a so-called carrier replica signal. The aim is to have a phase of the carrier replica signal adapted to, or aligned with, at least a phase of the digital baseband signal S2.

As detailed above, due to temperature effects, usage of CapTune switching-based VCOs in the down conversion of the received satellite signal S1, may introduce phase shifts in the down-converted signal S1a which are reflected in the digital baseband signal S2. Without any further countermeasures, phase jumps of the digital baseband signal S2 at the input of the tracking engine 30, respectively tracking loop, may lead to a loss of the satellite signal and disruption of the navigation.

An objective could therefore be seen in providing a solution which overcomes the above shortcomings of existing implementations and compensates for a phase jump without losing a signal that is to be tracked.

The objective is achieved by the subject-matter of the independent claims. Embodiments and developments are defined in the dependent claims.

The definitions provided above also apply to the following description unless stated otherwise.

SUMMARY

In one embodiment a method for adjusting a phase of a carrier replica signal comprises the following steps:
  receiving, by a tracking loop, a digital baseband signal,
  generating within the tracking loop the carrier replica signal,
  generating within the tracking loop a sequence of samples from the digital baseband signal and the carrier replica signal,
  controlling a phase of the carrier replica signal depending on the sequence of samples,
  receiving a trigger signal indicating an upcoming phase shift of the digital baseband signal,
  blanking the tracking loop and controlling the phase of the carrier replica signal using a constant value,
  determining a magnitude of the phase shift,
  adjusting the phase of the carrier replica signal using the determined magnitude of the phase shift, and
  un-blanking the tracking loop and controlling the phase of the carrier replica signal depending on the sequence of samples.

The tracking loop receives the digital baseband signal, generates the carrier replica signal and generates the sequence of samples from the digital baseband signal and the carrier replica signal, for example by a mixing operation. The phase of the carrier replica signal is controlled, for instance in a control loop implemented inside the tracking loop, depending on the sequence of samples, specifically as a function of a number of samples provided with the previously generated sequence of samples. During this regulation process at some point in time the trigger signal is received which indicates the upcoming phase shift of the digital baseband signal. Immediately after receipt of this trigger signal, the tracking loop is blanked and the phase of the carrier replica signal is controlled using the constant value. In other words, control of the phase of the carrier replica signal changes from using recently generated samples of the tracking loop, as done before receipt of the trigger signal, to using the constant value for control of the carrier replica signal's phase. While the tracking loop is blanked, the magnitude of the phase shift is determined. The phase of the carrier replica signal is then adjusted or corrected by this determined magnitude. Subsequently, the tracking loop is un-blanked and control of the phase of the carrier replica signal, depending on the sequence of samples, is resumed by the tracking loop.

By blanking the tracking loop, continuous adaptation of the phase of the carrier replica signal to the sequence of samples produced at the output of the carrier loop is stopped or interrupted. Consequently, a phase jump occurring in the digital baseband signal at the input of the tracking loop is not propagated to the generation of the carrier replica signal, especially the control of its phase. During the blanking or masking of the tracking loop, control of the phase of the carrier replica signal is decoupled from the sequence of samples generated by the tracking loop while a phase shift of the digital baseband signal occurs. Rather, the phase of the carrier replica signal is adjusted with the determined magnitude of the phase shift. The blanking of the tracking loop can then be removed because the phase jump of the baseband signal has been compensated for in the proposed method. Thus, loss of the satellite signal which is tracked with the tracking loop is prevented and navigation continues without interruption.

According to a development the constant value comprises a phase value generated from at least one sample of the sequence of samples generated before, especially immediately before, blanking the tracking loop.

In an exemplary implementation the constant value is calculated from the difference between two samples or as an average of a number of samples of the sequence of samples generated immediately before blanking the tracking loop.

In a development blanking the tracking loop and controlling the phase of the carrier replica signal using the constant value comprises interrupting a feedback path within the tracking loop and using the constant value for controlling the phase of the carrier replica signal instead of the sequence of samples generated during the blanking and before the un-blanking of the tracking loop.

During the period of time in which the tracking loop is blanked, samples for the sequence or series of samples keep being generated. However, these samples are not used for controlling the phase of the carrier replica signal during blanking. Consequently, a phase jump of the baseband signal does not affect generation of the carrier replica signal. Tracking of a satellite signal is continued without interruption.

According to a development, blanking the tracking loop and controlling the phase of the carrier replica signal using the constant value comprises using the sequence of samples generated during the blanking and before the un-blanking of the tracking loop only for determining the magnitude of the phase shift.

The samples of the sequence of samples generated during the period of time in which the tracking loop is blanked or offline or masked, form the basis for determining the magnitude of the phase shift. These samples reflect the phase jump of the digital baseband signal and therefore are not propagated outside of the tracking loop and are not used for the otherwise continuous control of the phase of the carrier replica signal.

In a development determining the magnitude of the phase shift is executed after blanking the tracking loop and controlling the phase of the carrier replica signal using the constant value and before adjusting the phase of the carrier replica signal using the determined magnitude of the phase shift. Furthermore, determining the magnitude of the phase shift comprises calculating a difference in phase between at least one sample of the sequence of samples generated before, especially immediately before, blanking the tracking loop and at least one sample of the sequence of samples generated after blanking the tracking loop and before adjusting the phase of the carrier replica signal.

In an option, determining the magnitude of the phase shift further comprises, after calculating the difference in phase, determining that the calculated difference is larger than a predefined threshold value.

The threshold value may be used to avoid repeated adjustment of the phase of the carrier replica signal, for example, in the case that the phase jump of the digital baseband signal can be compensated without interrupting the tracking loop. In an example, the threshold value amounts to five degrees of phase shift.

According to a development, un-blanking the tracking loop and controlling the phase of the carrier replica signal depending on the sequence of samples comprises closing the feedback path within the tracking loop.

As explained above, by means of the control loop with feedback path, the phase of the carrier replica signal is controlled within the tracking loop as long as the trigger signal is not received. Upon receipt of the trigger signal the feedback path is opened or interrupted, such that the phase of the carrier replica signal is controlled using the constant value as detailed above. After adjusting the phase of the carrier replica signal according to the magnitude of the phase shift, said feedback path is closed again for un-blanking the tracking loop.

Optionally, the sequence of samples generated after the un-blanking is propagated as usual outside the tracking loop.

According to an aspect, each sample of the sequence of samples comprises an in-phase component I and a quadrature phase component Q.

Said samples may also be referred to as "I/Q samples".

The carrier replica signal is substantially identical to a carrier signal in the baseband which is modulated according to the information provided by the satellite.

In various implementations the digital baseband signal comprises a live satellite signal according to a global navigation satellite system or, alternatively, the digital baseband signal comprises an emulated satellite signal according to the global navigation satellite system.

This means that in the first alternative the digital baseband signal corresponds to a received satellite signal which has been down converted using a reference clock signal as known by those skilled in the art. In the second alternative, the digital baseband signal is an emulated satellite signal which is used for test purposes. Contrary to the signal of the first alternative, the emulated satellite signal is generated within a receiver.

In various implementations the digital baseband signal corresponds to a global navigation satellite system RF signal which is down converted and subsequently digitized. A reference clock signal is used in down conversion of the RF signal. Therein a phase shift of the reference clock signal is reflected as a phase shift in the digital baseband signal.

The phase shift of the reference clock signal may thereby be caused by CapTune switching of an RF PLL used in the generation of the reference clock signal. By means of the proposed method, a phase shift of the reference clock signal which propagates into the digital baseband signal does not disturb the tracking loop during tracking of the satellite signal. Tracking of the satellite signal can be accomplished continuously.

The digital baseband signal is generated outside of the tracking loop, for instance by a baseband processing circuit as shown in FIG. 5 and as known to those skilled in the art.

In various implementations generating the sequence of samples within the tracking loop comprises multiplication of the digital baseband signal with the carrier replica signal and subsequent integration. Therein, a time period of the integration is longer than a transient caused by the phase shift of the digital baseband signal.

Generation of the sequence of samples may additionally comprise, after the multiplication, an additional multiplication with a code signal and subsequent integration. The resulting samples contributing to the sequence may have an I- and a Q-component which may be represented as an I/Q vector. As long as the phase of the carrier replica signal is properly tracked, resulting I/Q vectors of the samples have only one component which is different from zero, for example, the I component. If a phase shift occurs and is not compensated for, i.e. without using the proposed method, resulting I/Q vectors have an I and a Q component.

As the satellite signal's tracking is relatively slow, a phase shift can be compensated for without losing track of the satellite signal with the proposed method.

In one embodiment a tracking loop comprises processing means for carrying out the method according to the embodiments or developments described above.

A traditional tracking loop can be improved by integrating the proposed method within.

In one embodiment a global navigation satellite system receiver comprises the tracking loop as described above.

Thereby uninterrupted navigation despite phase shifts in the baseband is enabled.

As known to those skilled in the art, the GNSS receiver for correct operation may also comprise an RF front-end circuit, and a baseband processing circuit.

In an embodiment a computer program product comprises instructions to cause the tracking loop just specified to execute the method according to the embodiments described above.

According to an implementation option, the method described above is implemented in firmware.

This realization enables seamless integration with existing tracking loop firmware.

In one embodiment a computer readable medium has the computer program as specified above stored thereon.

BRIEF DESCRIPTION OF THE DRAWINGS

The text below explains the proposed solution in detail using exemplary embodiments with reference to the drawings. Components and elements that are functionally identical or have an identical effect bear identical reference numbers. Insofar as parts or components correspond to one another in their function, a description of them will not be repeated in each of the following figures. Therein.

DETAILED DESCRIPTION

Figure 6:
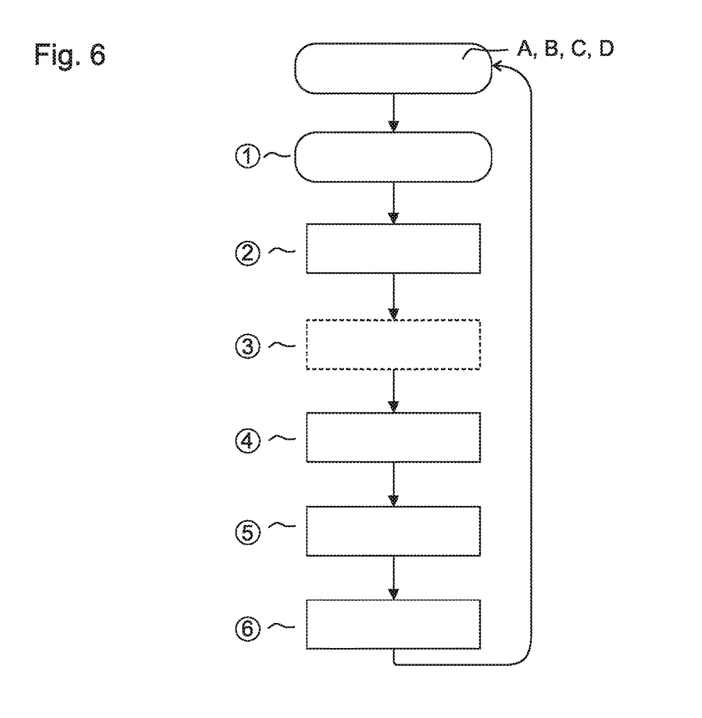
FIG. 6 shows an exemplary embodiment of a method as proposed.

FIG. 6 shows an exemplary embodiment of a method as proposed. The method for adjusting a phase of a carrier replica signal comprises the following steps:

A: receiving, by a tracking loop, a digital baseband signal,
B: generating within the tracking loop the carrier replica signal,
C: generating within the tracking loop a sequence of samples from the digital baseband signal and the carrier replica signal,
D: controlling a phase of the carrier replica signal depending on the sequence of samples,
1: receiving a trigger signal indicating an upcoming phase shift of the digital baseband signal,
2: blanking the tracking loop and controlling the phase of the carrier replica signal using a constant value,
4: determining a magnitude of the phase shift,
5: adjusting the phase of the carrier replica signal using the determined magnitude of the phase shift, and
6: un-blanking the tracking loop and controlling the phase of the carrier replica signal depending on the sequence of samples.

Therein, steps A to D represent a normal operation of the tracking loop. That means operation of the tracking loop without a major phase jump in the baseband signal. Steps 1, 2 and 4 to 6 are used to compensate for a phase shift of the digital baseband signal. This phase shift would otherwise lead to a phase shift in the carrier replica signal and possibly to a loss of the satellite signal to be tracked.

Optionally, the method may comprise a step 3 in which a confirmation signal is provided which causes a PLL, especially an RF PLL, to update its CapTune configuration which results in the phase jump of the baseband signal.

As indicated in FIG. 6, after step 6 the method returns to step A, continuing with normal operation of the tracking loop.

Figure 7:
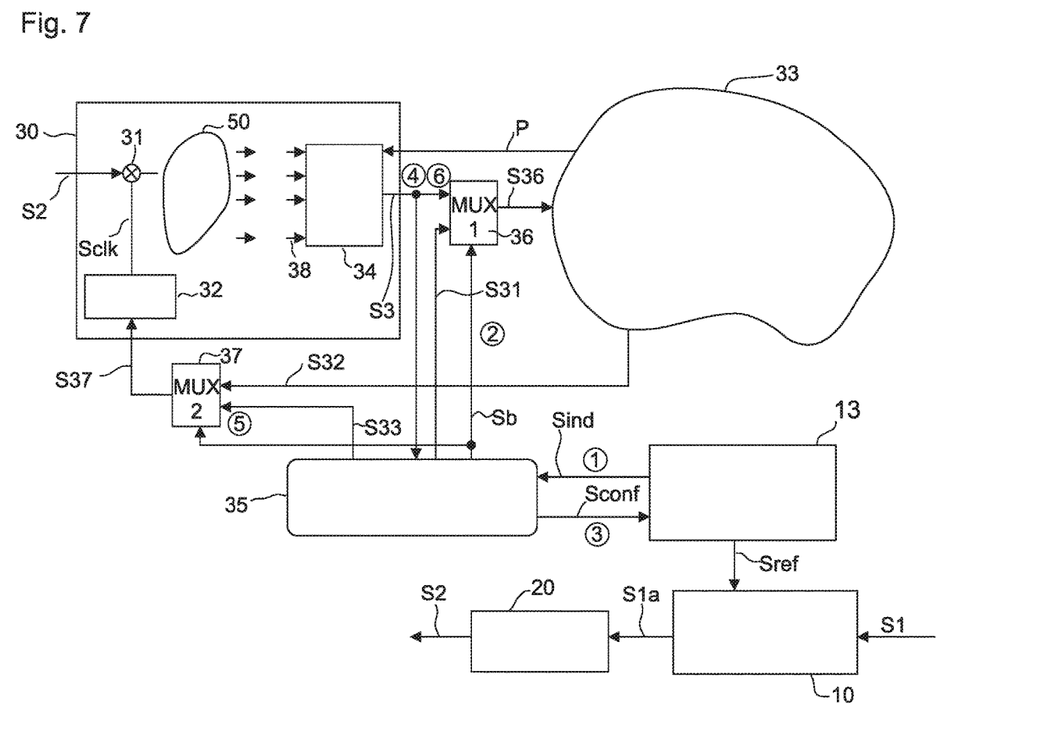
FIG. 7 shows an exemplary embodiment of a tracking loop as proposed.

Further details of the method are provided in connection with FIG. 7.

FIG. 7 shows an exemplary embodiment of a tracking loop as proposed. The tracking loop comprises a tracking engine 30, a loop module 33, a control module 35, a first multiplexer 36 and a second multiplexer 37. The tracking engine 30 has a mixer 31, an oscillator 32, a correlation and integration module 50 and a memory 34. The oscillator 32 may be realized as a numerically controlled oscillator, NCO. It is configured to provide a carrier replica signal Sclk.

The tracking engine 30 of the tracking loop receives a digital baseband signal S2 from a baseband processing circuit 20 depicted in the lower part of FIG. 7. Within the tracking engine 30 the mixer 31 multiplies the digital baseband signal S2 with the carrier replica signal Sclk. In detail, I/Q samples of the digital baseband signal S2 are multiplied with the carrier replica signal Sclk. The product is correlated and integrated in correlation and integration module 50 and I/Q samples 38 resulting therefrom are stored in the memory 34. A number of samples 38 can be retrieved from the memory 34 as a sequence of samples S3 representing the tracked satellite signal.

For generating the sequence of samples S3, the tracking loop controls a phase of the carrier replica signal Sclk.

During normal operation as depicted in steps A, B, C and D of FIG. 6, the tracking loop receives the digital baseband signal S2. As shown in the lower part of FIG. 7, the digital baseband signal S2 results from an RF signal S1, which is received from a satellite for instance, and is down converted in an RF front-end circuit 10 to a down-converted signal S1a. Said down converted signal S1a is processed in the baseband processing circuit 20 which provides the digital baseband signal S2. For down conversion of the RF signal S1a reference clock signal Sref is used which is provided by an RF PLL 13. Said RF PLL 13 may be implemented by an LC-VCO, the frequency of which is adapted using the CapTune switching operation described above.

During normal operation samples of the sequence of samples S3 are extracted from the memory 34 at the location which is indicated by a dump pointer P via the first multiplexer 36 as a sample signal S36. The loop module 33 therefrom calculates a phase control value which is supplied as a tracking loop phase signal S32. The second multiplexer 37 forwards this phase control value with a phase control signal S37 which adjusts a phase of the oscillator 32 which provides the carrier replica signal Sclk.

Whenever the RF PLL 13 reaches an edge of its operating range due to temperature effects, as described above with reference to FIGS. 2 and 4, it sends an indication signal Sind which is perceived as the trigger signal by the control module 35 in step 1.

The control module 35 then provides a blanking signal Sb in step 2 to the first and the second multiplexer 36, 37 for their configuration. Thereby, the feedback path of the loop module 33 is opened. Consequently, the latest values of the sequence S3 stored in the dump memory 34 are transferred to the control module 35 and used as a constant value which is provided as an offline sample signal S31 to the first multiplexer 36 and further by the sample signal S36 to the loop module 33. The tracking loop, in particular the loop module 33 is thereby blanked and the phase of the carrier replica signal Sclk is controlled by control module 35 using this constant value.

Optionally in step 3 a confirmation signal Sconf is provided to the RF PLL 13 to initiate updating its CapTune configuration, for instance by updating its CapTune register. A rigid phase shift in the digital baseband signal S2 is the consequence of this CapTune register update. Said phase shift is reflected by the samples of the sequence of samples S3 produced during the blanking of the tracking loop.

These samples are also passed to the control module 35 and used for determining the magnitude of the phase shift. For this a difference to the previously stored samples, i.e. the samples that were generated before the blanking, is calculated, for example. This corresponds to step 4 of the method.

Then according to step 5, a new phase control value which has been calculated is provided by means of an algorithm phase signal S33 via the second multiplexer 37 and finally by the phase control signal S37 to the oscillator 32. The phase of the carrier replica signal Sclk is consequently adjusted. In an exemplary implementation the new phase control value is calculated from an inverse tangent of a ratio of Q and I component.

Subsequently, according to step 6, the tracking loop is un-blanked. For this, the blanking signal Sb configures first and second multiplexers 36, 37 such that the feedback path of the tracking loop is closed. Consequently, the sample signal S36 routes the sequence of samples S3 from the memory 34. The phase control signal S37 routes the tracking loop phase signal S32.

By means of the proposed solution, a phase shift of the reference clock signal Sref which is reflected in the digital baseband signal S2 is compensated for and loss of the tracking of the signals is avoided.

The control module 35 may be implemented in the form of a firmware component separate from or integrated with the loop module 33 which may also be realized in firmware. The first and second multiplexer 36, 37 may also be implemented in firmware. These different firmware components may as well be combined or integrated.

The tracking loop described above may be comprised in a GNSS receiver as proposed. The GNSS receiver may additionally have the RF front-end circuit 10 and the baseband processing circuit as shown in FIG. 7.

Figure 8:
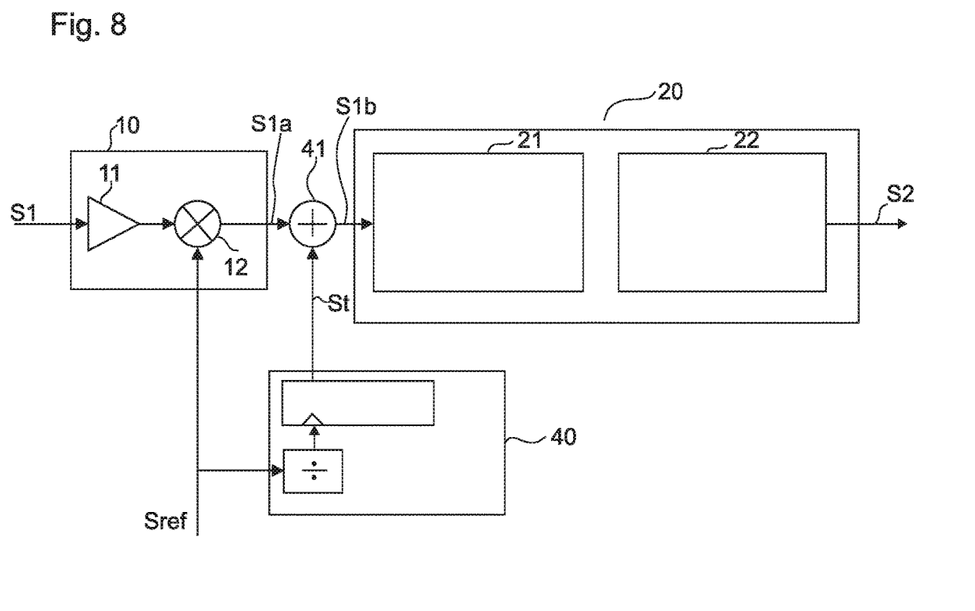
FIG. 8 shows another example of a GNSS receiver.

FIG. 8 shows another example of a GNSS receiver. The example of FIG. 8 coincides with the GNSS receiver of FIG. 5 and additionally has a test signal generator 40. The test signal generator 40 is configured to generate a test signal St as an analogue baseband signal. The test signal generator 40 may therefore use a clock, for instance the reference clock signal Sref as depicted in FIG. 8, which is divided and used as a clock for a signal generator which provides the test signal St. The test signal St is added to the down-converted signal S1a in signal adder 41, which gives a down-converted test signal S1b which is fed into the baseband processing circuit 20. As already described above, the down-converted test signal S1b emulates a satellite signal for test purposes.

Figure 9:
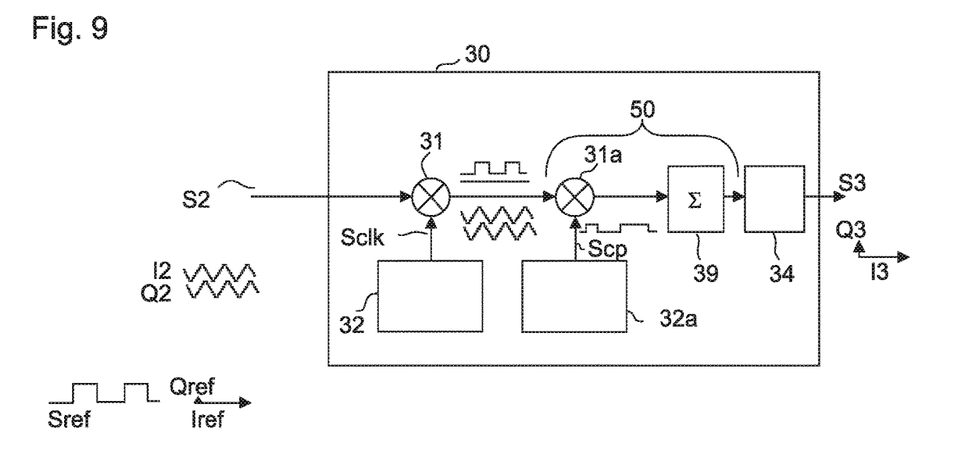
FIG. 9 shows an example of a tracking loop.
Figure 10:
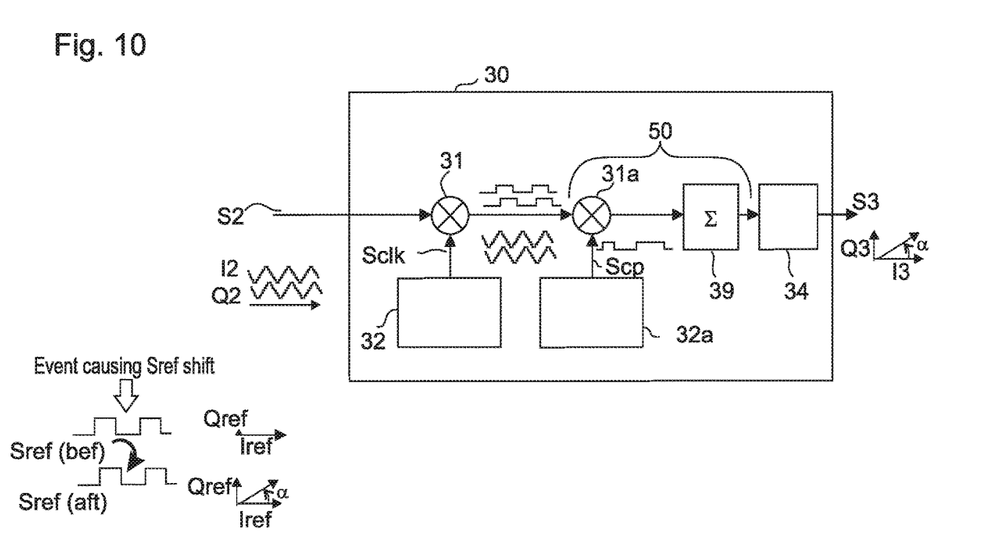
FIG. 10 shows another example of a tracking loop.

FIGS. 9 and 10 show examples of a tracking loop and the various signals therein. In each case the tracking engine 30 is depicted in more detail. In addition to the realization of FIG. 7, the tracking engine 30 of FIG. 9 has a multiplier 31a coupled downstream to the first mixer 31. The multiplier 31a multiplies the signal received from the first mixer 31 with a pseudo-random noise (PRN) code Scp provided by a code NCO 32a in order to despread the satellite signal. The resulting signal is integrated in integrator 39 and stored in memory 34 as described above. As shown on the left-hand side, the digital baseband signal S2 is represented by an I/Q stream of samples, including either the signal of the tracked satellite or the test signal. The stream of I2 and Q2 samples of the digital baseband signal S2 is depicted in a symbolic way. Also, the reference clock signal Sref, which is generated by the RF PLL 13 of FIG. 7 for instance, is also shown as having an I and a Q component, named Qref and Iref. Without any phase shift in the reference clock signal Sref and the digital baseband signal S2, the resulting sequence of samples S3 in the depicted example just has an I component I3 different from zero, while the Q component Q3 is at zero.

FIG. 10 shows what happens when a phase shift occurs in the reference clock signal Sref. As can be seen, the phase of the reference clock signal changes from Sref (bef) to Sref (aft). Consequently, before the phase shift the reference clock signal Sref just has an I component, while after the phase shift the reference signal Sref has an I and a Q component different from zero. This is reflected in the digital baseband signal S2 and in the sequence of samples S3, which now also have an I and a Q component I3, Q3 different from zero.

The proposed method and tracking loop prevent loss of the tracked satellite signal caused by such phase shift of the reference clock signal, respectively the digital baseband signal.

It will be appreciated that the invention is not limited to the disclosed embodiments and to what has been particularly shown and described hereinabove. Rather, features recited in separate dependent claims or in the description may advantageously be combined. Furthermore, the scope of the invention includes those variations and modifications which will be apparent to those skilled in the art and fall within the scope of the appended claims. The term "comprising" used in the claims or in the description does not exclude other elements or steps of a corresponding feature or procedure. In the case that the terms "a" or "an" are used in conjunction with features, they do not exclude a plurality of such features. Moreover, any reference signs in the claims should not be construed as limiting the scope.

REFERENCE LIST 1, 2, 3, 4, 5, 6 step
10 RF front-end circuit

11 LNA
12, 31 mixer
31a multiplier
13 RF PLL
20, 21, 22 baseband processing circuit
30 tracking engine
32 oscillator
32a code NCO
33 loop module
34 memory
35 control module
36, 37 multiplexer
38 sample
39 integrator
40 test signal generator
50 correlation and integration module
A, B, C, D step
Sin, Sfb, Sout, Sind, Sb signal
S3 sequence of samples
S31, S32, S33, S36, S37 signal
Vcont control voltage
Qa, Qb control signal
I1, I2 current source/sink
S111, S222 switch
Rp, Rn resistance
S1, S2, S1a, Sref, Sclk signal
S1a, S1b, Sb, St, Scp, Sconf signal
P pointer

The invention claimed is:

1. A method for adjusting a phase of a carrier replica signal, the method comprising:
receiving, by a tracking loop, a digital baseband signal,
generating within the tracking loop the carrier replica signal,
generating within the tracking loop a sequence of samples from the digital baseband signal and the carrier replica signal,
controlling a phase of the carrier replica signal depending on the sequence of samples,
receiving a trigger signal indicating an upcoming phase shift of the digital baseband signal,
blanking the tracking loop and controlling the phase of the carrier replica signal using a constant value,
determining a magnitude of the phase shift,
adjusting the phase of the carrier replica signal using the determined magnitude of the phase shift, and
un-blanking the tracking loop and controlling the phase of the carrier replica signal depending on the sequence of samples.

2. The method according to claim 1, wherein the constant value comprises a phase value generated from at least one sample of the sequence of samples generated before blanking the tracking loop.

3. The method according to claim 1, wherein blanking the tracking loop and controlling the phase of the carrier replica signal using the constant value comprises:
interrupting a feedback path within the tracking loop, and
using the constant value for controlling the phase of the carrier replica signal instead of a phase computed based on the sequence of samples generated during the blanking and before the un-blanking the tracking loop.

4. The method according to claim 1, wherein blanking the tracking loop and controlling the phase of the carrier replica signal using the constant value comprises using the sequence of samples generated during the blanking and before the un-blanking the tracking loop only for determining the magnitude of the phase shift.

5. The method according to claim 1,
wherein determining the magnitude of the phase shift is executed after blanking the tracking loop and controlling the phase of the carrier replica signal using the constant value and before adjusting the phase of the carrier replica signal using the determined magnitude of the phase shift, and
wherein determining the magnitude of the phase shift comprises calculating a difference in phase between at least one sample of the sequence of samples generated before blanking the tracking loop and at least one sample of the sequence of samples generated after blanking the tracking loop and before adjusting the phase of the carrier replica signal.

6. The method according to claim 5, wherein determining the magnitude of the phase shift further comprises, after calculating the difference in phase, determining that the calculated difference is larger than a pre-defined threshold value.

7. The method according to claim 1, wherein un-blanking the tracking loop and controlling the phase of the carrier replica signal depending on the sequence of samples comprises closing a feedback path within the tracking loop.

8. The method according to claim 1, wherein each sample of the sequence of samples comprises an in-phase component and a quadrature-phase component.

9. The method according to claim 1,
wherein the digital baseband signal comprises a live satellite signal according to a global navigation satellite system or
wherein the digital baseband signal comprises an emulated satellite signal according to the global navigation satellite system.

10. The method according to claim 1,
wherein the digital baseband signal corresponds to a global navigation satellite system radio-frequency (RF) signal which is down converted and subsequently digitized,
wherein a reference clock signal is used in down conversion of the RF signal,
wherein a phase shift of the reference clock signal is reflected in the phase shift of the digital baseband signal.

11. The method according to claim 1,
wherein generating within the tracking loop the sequence of samples comprises multiplication of the digital baseband signal with the carrier replica signal and subsequent integration, and
wherein a time period of the integration is longer than a transient caused by the phase shift of the digital baseband signal.

12. A global navigation satellite system receiver comprising:
a tracking loop including one or more processors; and
one or more computer memory devices interoperably coupled with the one or more processors and having tangible, non-transitory, machine-readable media storing one or more instructions that, when executed by the one or more processors, cause the one or more processors to perform operations comprising:
generating within the tracking loop a carrier replica signal in response to receiving, by the tracking loop, a digital baseband signal,
generating within the tracking loop a sequence of samples from the digital baseband signal and the carrier replica signal, controlling a phase of the carrier replica signal depending on the sequence of samples, receiving a trigger signal indicating an upcoming phase shift of the digital baseband signal, blanking the tracking loop and controlling the phase of the carrier replica signal using a constant value, determining a magnitude of the phase shift, adjusting the phase of the carrier replica signal using the determined magnitude of the phase shift, and un-blanking the tracking loop and controlling the phase of the carrier replica signal depending on the sequence of samples.

13. At least one tangible, non-transitory, computer readable medium storing instructions that, when executed by one or more machines, cause the one or more machines to perform operations comprising:

generating within a tracking loop a carrier replica signal in response to receiving, by the tracking loop, a digital baseband signal, generating within the tracking loop a sequence of samples from the digital baseband signal and the carrier replica signal, controlling a phase of the carrier replica signal depending on the sequence of samples, receiving a trigger signal indicating an upcoming phase shift of the digital baseband signal, blanking the tracking loop and controlling the phase of the carrier replica signal using a constant value, determining a magnitude of the phase shift, adjusting the phase of the carrier replica signal using the determined magnitude of the phase shift, and un-blanking the tracking loop and controlling the phase of the carrier replica signal depending on the sequence of samples.

14. At least one tangible, non-transitory, computer readable medium according to claim 13, wherein the constant value comprises a phase value generated from at least one sample of the sequence of samples generated before blanking the tracking loop.

15. At least one tangible, non-transitory, computer readable medium according to claim 13 wherein blanking the tracking loop and controlling the phase of the carrier replica signal using the constant value comprises using the sequence of samples generated during the blanking and before the un-blanking the tracking loop only for determining the magnitude of the phase shift.

16. At least one tangible, non-transitory, computer readable medium according to claim 15, wherein determining the magnitude of the phase shift is executed after blanking the tracking loop and controlling the phase of the carrier replica signal using the constant value and before adjusting the phase of the carrier replica signal using the determined magnitude of the phase shift, and wherein determining the magnitude of the phase shift comprises calculating a difference in phase between at least one sample of the sequence of samples generated before blanking the tracking loop and at least one sample of the sequence of samples generated after blanking the tracking loop and before adjusting the phase of the carrier replica signal.

17. At least one tangible, non-transitory, computer readable medium according to claim 16, wherein determining the magnitude of the phase shift further comprises, after calculating the difference in phase, determining that the calculated difference is larger than a pre-defined threshold value.

18. At least one tangible, non-transitory, computer readable medium according to claim 13, wherein un-blanking the tracking loop and controlling the phase of the carrier replica signal depending on the sequence of samples comprises closing a feedback path within the tracking loop.

19. At least one tangible, non-transitory, computer readable medium according to claim 13, wherein each sample of the sequence of samples comprises an in-phase component and a quadrature-phase component.

* * * * *